US008512876B2

(12) United States Patent
Kim et al.

(10) Patent No.: US 8,512,876 B2
(45) Date of Patent: *Aug. 20, 2013

(54) ORGANIC EL DEVICE

(75) Inventors: Myung Seop Kim, Seoul (KR); Hyung Yun Oh, Seoul (KR); Jae Woo Kyung, Seoul (KR); Sung Kab Kim, Seoul (KR); Jae Man Lee, Seoul (KR); Young Soo Han, Seoul (KR); Chun Gun Park, Seoul (KR); Jong Geun Yoon, Seoul (KR); Sae Tae Park, Seoul (KR)

(73) Assignee: LG Electronics Inc., Seoul (KR)

( * ) Notice: Subject to any disclaimer, the term of this patent is extended or adjusted under 35 U.S.C. 154(b) by 353 days.

This patent is subject to a terminal disclaimer.

(21) Appl. No.: 12/342,746

(22) Filed: Dec. 23, 2008

(65) Prior Publication Data

US 2009/0115329 A1    May 7, 2009

Related U.S. Application Data

(63) Continuation of application No. 11/861,595, filed on Sep. 26, 2007, now Pat. No. 7,485,377, which is a continuation of application No. 10/910,341, filed on Aug. 4, 2004, now Pat. No. 7,297,417.

(30) Foreign Application Priority Data

Aug. 14, 2003  (KR) .......................... P2003-0056517

(51) Int. Cl.
   *H01L 51/54*     (2006.01)
(52) U.S. Cl.
   USPC ............ 428/690; 428/917; 313/504; 313/506

(58) Field of Classification Search
   None
   See application file for complete search history.

(56) References Cited

U.S. PATENT DOCUMENTS

| 5,674,597 | A | 10/1997 | Fujii et al. | |
| 6,166,488 | A | 12/2000 | Arai | |
| 6,280,861 | B1 | 8/2001 | Hosokawa et al. | |
| 6,423,429 | B2 * | 7/2002 | Kido et al. | 428/690 |
| 6,456,003 | B1 * | 9/2002 | Mori et al. | 313/504 |
| 6,486,601 | B1 | 11/2002 | Sakai et al. | |
| 6,627,333 | B2 * | 9/2003 | Hatwar | 428/690 |
| 2002/0086180 | A1 | 7/2002 | Seo et al. | |

(Continued)

FOREIGN PATENT DOCUMENTS

| EP | 1009198 A1 * | 6/2000 |
| EP | 1017118 | 7/2000 |

(Continued)

OTHER PUBLICATIONS

International Search Report issued by Austrian Patent Office on Nov. 5, 2004.

(Continued)

*Primary Examiner* — Dawn Garrett
(74) *Attorney, Agent, or Firm* — KED & Associates LLP

(57) ABSTRACT

An organic EL device is disclosed, which has an organic multilayer between a first electrode and a second electrode, the organic multilayer comprising a hole injection layer formed on the first electrode, and formed of a mixture of at least one selected from organic materials and at least one selected from inorganic materials; a hole transport layer having at least one layer on the hole injection layer; and an emitting layer formed on the hole transport layer.

12 Claims, 3 Drawing Sheets

(56) References Cited

U.S. PATENT DOCUMENTS

| | | |
|---|---|---|
| 2002/0135296 A1 | 9/2002 | Aziz et al. |
| 2003/0049489 A1* | 3/2003 | Hatwar et al. ............ 428/690 |
| 2003/0107042 A1 | 6/2003 | Chang et al. |
| 2003/0146439 A1 | 8/2003 | Yamazaki et al. |
| 2004/0001968 A1* | 1/2004 | Hatwar et al. ............ 428/690 |
| 2004/0046496 A1* | 3/2004 | Mishima ................... 313/504 |
| 2004/0185300 A1* | 9/2004 | Hatwar et al. ............ 428/690 |
| 2004/0241491 A1* | 12/2004 | Hatwar ..................... 428/690 |
| 2005/0014018 A1* | 1/2005 | Klubek et al. ............. 428/690 |
| 2006/0019116 A1* | 1/2006 | Conley et al. ............ 428/690 |

FOREIGN PATENT DOCUMENTS

| | | |
|---|---|---|
| EP | 1 096 835 A1 | 5/2001 |
| JP | 10-149883 | 6/1998 |
| JP | 11-251067 | 9/1999 |
| JP | 2000-012229 | 1/2000 |
| JP | 2000-40590 | 2/2000 |
| JP | 2001-233882 | 8/2001 |
| JP | 2002-100480 | 4/2002 |
| JP | 2002-313583 | 10/2002 |
| JP | 2002-356463 | 12/2002 |
| KR | 10-2003-0052028 | 6/2003 |

OTHER PUBLICATIONS

Korean Office Action dated Aug. 4, 2005.
Japanese Office Action dated Oct. 20, 2009.

* cited by examiner

ORGANIC EL DEVICE

This application is a Continuation of U.S. application Ser. No. 11/861,595, filed on Sep. 26, 2007, now U.S. Pat. No. 7,485,377, which is a Continuation of U.S. application Ser. No. 10/910,341, filed on Aug. 4, 2004, now U.S. Pat. No. 7,297,417, which claims the benefit of Korean Application No. P2003-56517 filed in Korea on Aug. 14, 2003. These documents are hereby incorporated by reference.

BACKGROUND OF THE INVENTION

1. Field of the Invention

The present invention relates to an organic EL (electroluminescence) device, and more particularly, to a hole injection layer of an organic EL device.

2. Discussion of the Related Art

In an organic EL (electroluminescence) device, when electric charges are injected to an organic emitting layer formed between the cathode and anode, hole and electron make a pair, and the pair of hole and electron annihilate, thereby generating light. The organic EL device has been attracted attention as the next generation display device in that it has low driving voltage and low power consumption.

Hereinafter, the related art organic EL device and method for manufacturing the same will be described with reference to the accompanying drawings.

FIG. 1 illustrates the related art organic EL device. Firstly, as shown in FIG. 1, the anode 2 as a first electrode is formed on a transparent substrate 1. At this time, the anode 2 is formed of ITO (indium-tin-oxide). Then, an HIL (hole injection layer) 3 is formed on the anode 2. In this case, the HIL 3 is usually formed of copper phthalocyanine (CuPc).

Subsequently, an HTL (hole transport layer) 4 is formed on the HIL 3. The HTL 4 is formed of N,N'-diphenyl-N,N'-bis (3-methylphenyl)-(1,1'biphenyl)-4,4'-diamine(TPD) or 4,4'-bis[N-(1-naphthyl)-N-phenyl-amino]biphenyl (NPD).

Next, an organic emitting layer 5 is formed on the HTL 4. At this time, a dopant may be added at needed. Then, an ETL (electron transport layer) 6 and an EIL (electron injecting layer) 7 are sequentially formed on the organic emitting layer 5. The EIL 7 is formed of LiF or $Li_2O$. After that, the cathode 8 as a second electrode is formed on the EIL 7 so that the manufacturing process of the organic EL device is completed.

However, the related art organic EL device has the following disadvantages.

The related art organic EL device has problems of low efficiency and short life span. When driving the related art organic EL device at a high voltage current, the thermal stress generates between the anode 2 and the HIL 3. Thus, the life span of device becomes short due to the thermal stress.

Also, since the organic material used for the HIL 3 has great motility of the hole, a hole-electron charge balance is lost so that quantum efficiency is lowered. That is, in case of the organic EL device requiring the low voltage driving, it is necessary to improve the quantum efficiency for the increase of efficiency. In this respect, the organic material used for the related art HIL is not suitable for improving the quantum efficiency.

SUMMARY OF THE INVENTION

Accordingly, the present invention is directed to an organic EL device that substantially obviates one or more problems due to limitations and disadvantages of the related art.

An object of the present invention is to provide an organic EL device to obtain great efficiency and long life span.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic EL device includes an organic multilayer formed between first and second electrodes, the organic multilayer comprising a hole injection layer formed on the first electrode, and formed of a mixture of at least one selected from organic materials and at least one selected from inorganic materials; a hole transport layer having at least one layer on the hole injection layer; and an emitting layer formed on the hole transport layer.

Furthermore, the organic EL device includes an electron transport layer formed on the emitting layer; and an electron injecting layer formed on the electron transport layer.

At this time, the organic material of the hole injection layer is any one selected from Aromatic amine group. Also, the organic material of the hole injection layer is expressed as the following chemical formula 1.

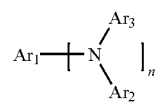

Chemical Formula 1

Also, 'n' of the chemical formula L is a positive number from 1 to 4, and at least any one of Ar1, Ar2 and Ar3 is selected from the Aromatic group substituted or not. Also, at least any one of Ar1, Ar2 and Ar3 is one of phenyl, naphthyl, biphenyl), biphenylelnyl, phenanthrenyl, fluoreyl, terphenylyl and anthracenyl groups. Also, a substituent of Ar1, Ar2 and Ar3 is one of methyl, ethyl, propyl, t-butyl, methoxy, ethoxy, propoxy, dimethylamine, diethylamine, phenyl, fluorin, clorine, bromine and diphenylamine groups.

Also, the organic material of the hole injection layer is any one of the following chemical formulas 2-7.

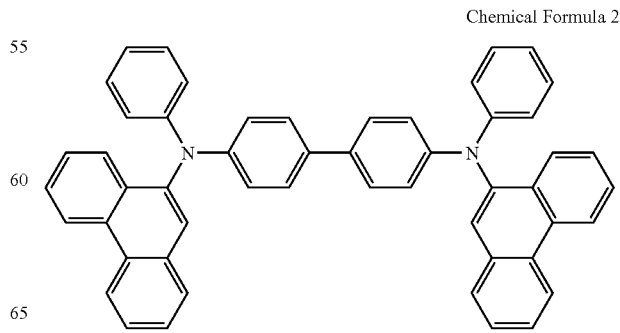

Chemical Formula 2

Chemical Formula 3

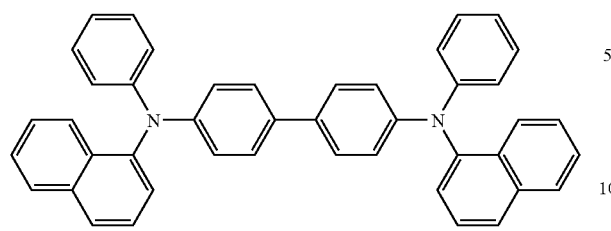

Chemical Formula 4

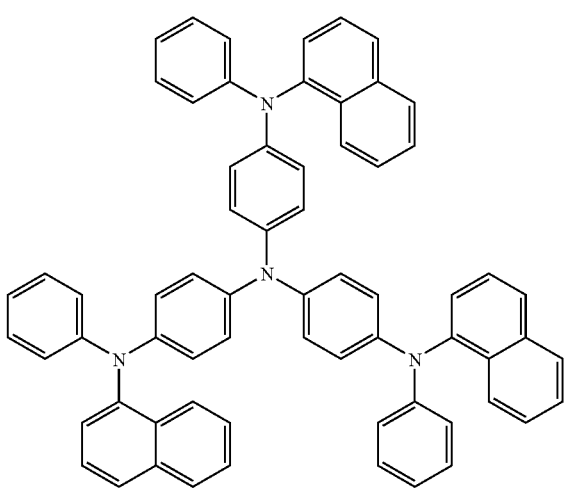

Chemical Formula 5

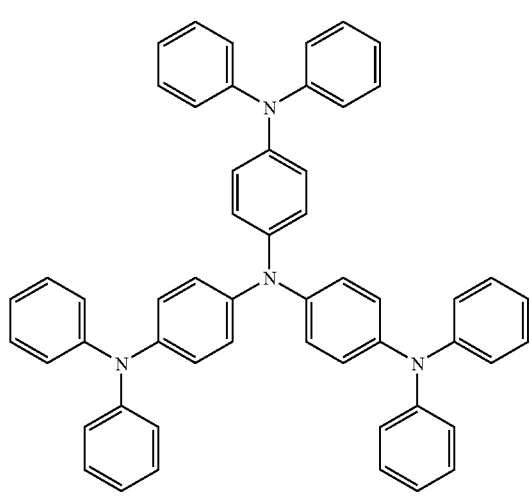

Chemical Formula 6

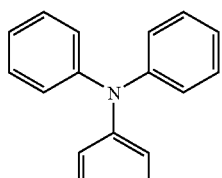
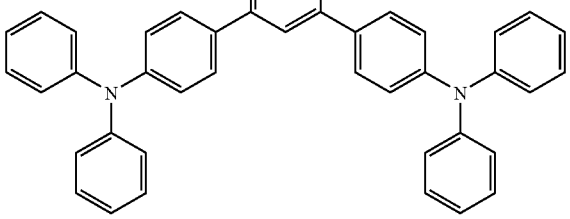

Chemical Formula 7

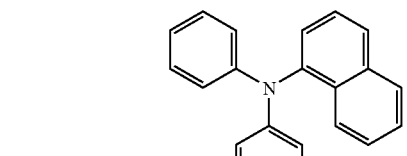

Meanwhile, the inorganic material of the hole injection layer is formed of any one of halide compound or oxide compound selected from 1A, 2A, 3A and 4A groups of the periodic table.

At this time, the halide compound is any one of LiF, NaF, KF, RbF, CsF and FrF, and the oxide compound is any one of $Li_2O$, $Na_2O$, $K_2O$, BeO, MgO, CaO, $B_2O_3$, $Al_2O_3$ and $SiO_2$.

Also, the hole injection layer is formed of at least one first-layer of organic material and at least one second-layer of inorganic material, and the first and second layers are alternately deposited.

At this time, each of the first and second layers is formed at a thickness of approx. 0.1 nm to 10 nm. Simultaneously, the hole injection layer is formed at a total thickness of approx. 0.1 nm to 300 nm.

Also, the hole injection layer is formed of a mixture of at least one selected from organic materials and at least one selected from inorganic materials.

At this time, the mixture has the organic material X and the inorganic material Y at the composition ratio of 1-100 to 1, or at the composition ratio of 1 to 1-100.

Also, the mixture has an organic material composition X value forming a gradient at a thickness direction, or an inorganic material composition Y value forming a gradient at a thickness direction.

At this time, the organic material composition X value obtains X=0 at an interface with the first electrode, and obtains X=1 at an interface with the hole transport layer, thereby maintaining 1>X>0 between the interface with the first electrode and the interface with the hole transport layer.

At this time, the inorganic material composition Y value obtains Y=0 at an interface with the first electrode, and obtains Y=1 at an interface with the hole transport layer, thereby maintaining 1>Y>0 between the interface with the first electrode and the interface with the hole transport layer.

Meanwhile, the hole injection layer is formed of two layers, and the respective layers are formed of different materials.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, an organic EL device according to the preferred embodiments of the present invention will be described with reference to the accompanying drawings.

Figure 1:
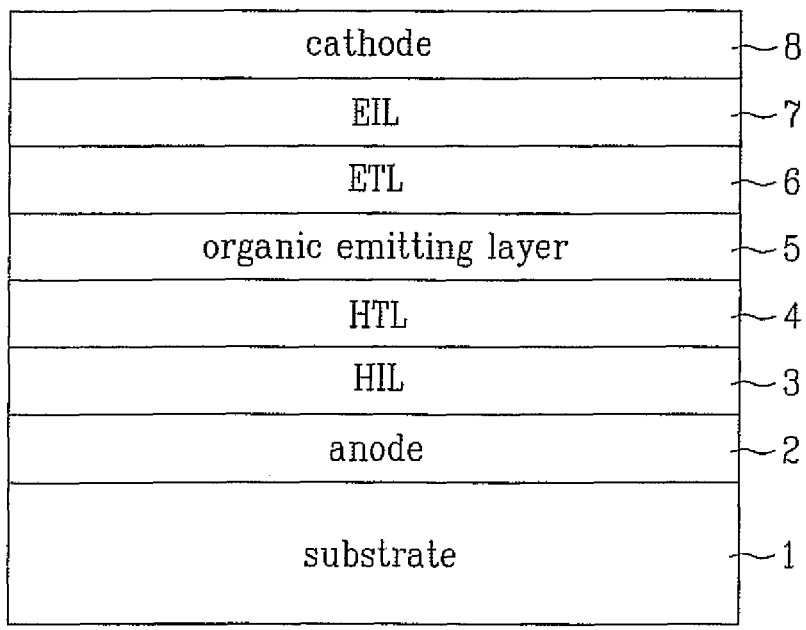
FIG. 1 illustrates a general organic EL device.
Figure 2:
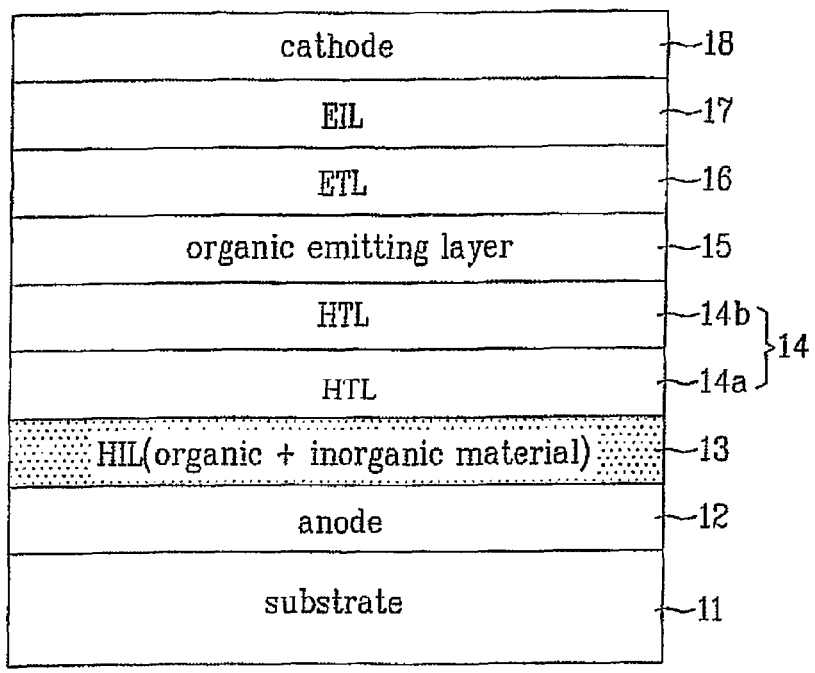
FIG. 2 and FIG. 3 illustrate an organic EL device according to the present invention.
Figure 3:
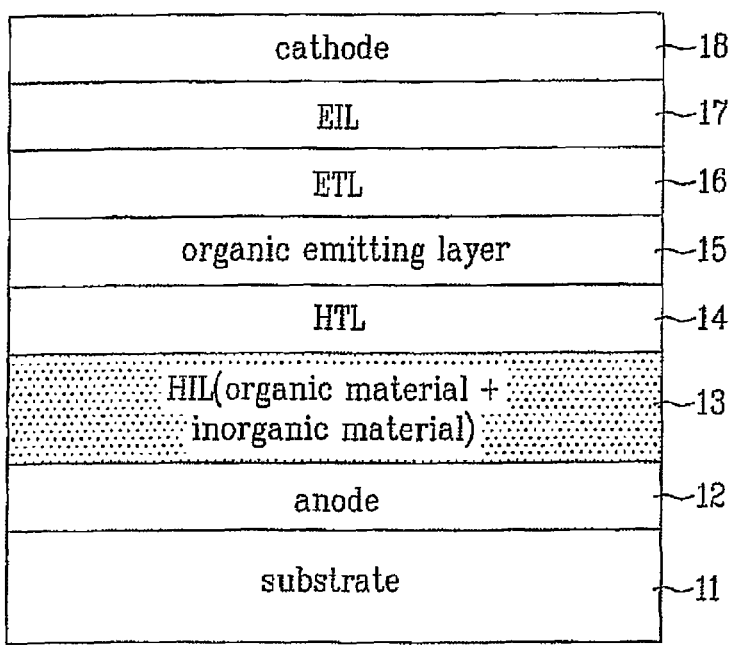

FIG. 2 and FIG. 3 illustrate the organic EL device according to the present invention. As shown in FIG. 2 and FIG. 3, the anode 12 as a first electrode is formed on a transparent substrate 1. At this time, the anode 12 is formed of ITO (indium-tin-oxide).

Then, an HIL (hole injection layer) 13 is formed on the anode 12. At this time, the HIL 13 is formed of a mixture of at least one selected from organic materials and at least one selected from inorganic materials. In this state, the organic material of the HIL 13 is any one selected from Aromatic amine group, which is expressed as following chemical formula 1,

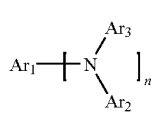

(Herein, 'n' is a positive number from 1 to 4, and at least any one of Ar1, Ar2 and Ar3 is selected from the aromatic group substituted or not).

Also, at least any one of Ar1, Ar2 and Ar3 may be one of phenyl, naphthyl, biphenyl), biphenylelnlyl, phenanthrenyl, fluoreyl, terphenylyl and anthracenyl groups. Then, a substituent of Ar1, Ar2 and Ar3 may be one of methyl, ethyl, propyl, t-buthyl, methoxy, ethoxy, propoxy, dimethylamine, diethylamine, phenyl, fluorin, clorine, bromine and diphenylamine groups.

For example, the HIL 13 may be any one of the following chemical formulas 2-7.

Chemical Formula 2

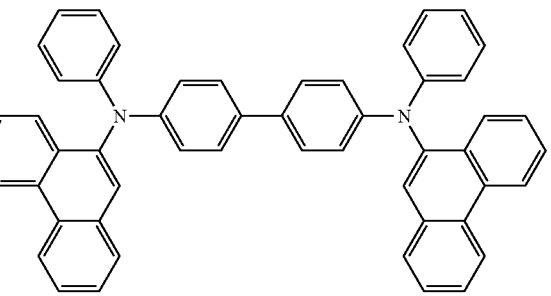

Chemical Formula 3

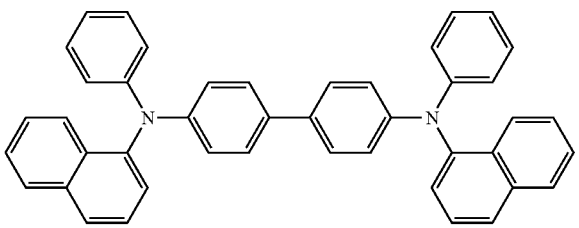

Chemical Formula 4

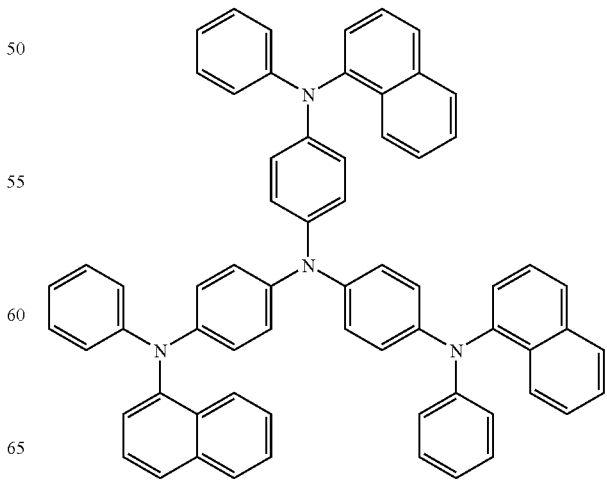

Chemical Formula 5

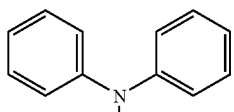

Chemical Formula 6

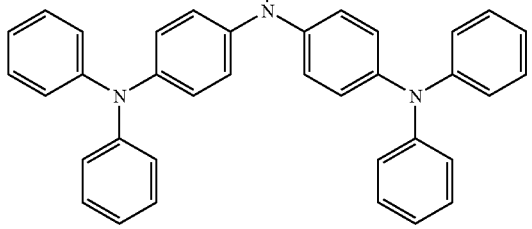

Chemical Formula 7

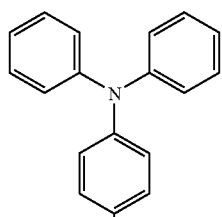
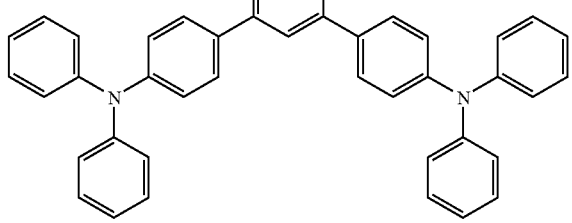

In the meantime, the HIL 13 may be formed of any one of halide compound or oxide compound selected from 1A, 2A, 3A and 4A groups of the periodic table. At this time, the halide compound may be LiF, NaF, KF, RbF, CsF or FrF. Also, the oxide compound may be $Li_2O$, $Na_2O$, $K_2O$, BeO, MgO, CaO, $B_2O_3$, $Al_2O_3$ or $SiO_2$.

Meanwhile, the HIL 13 may be formed of at least one first-layer of an organic material, and at least one second-layer of an inorganic material. In this state, the first and second layers are alternately deposited. Also, each of the first and second layers is formed at a thickness of approx. 0.1 nm to 10 nm. Simultaneously, the HIL 13 is formed at a total thickness of approx. 0.1 nm to 300 nm.

Also, the HIL 13 may be formed of a mixture of at least one selected from organic materials and at least one selected from inorganic materials. That is, the HIL 13 is formed in a method of mixing the organic and inorganic materials by co-deposition. In this case, the inorganic material is at 1-90% of the mixture. At this time, the HIL 13 is maintained at the total thickness of approx. 0.1 nm to 300 nm.

In case of the mixture of the organic and inorganic materials, an organic material composition X value may have a gradient at a thickness direction, or an inorganic material composition Y value may have a gradient at a thickness direction. That is, the organic material composition X value obtains X=0 at an interface with the anode 12, and obtains X=1 at an interface with an HTL (hole transport layer) 14, thereby maintaining 1>X>0 between the interface with the anode 12 and the interface with the HTL 14. Also, the inorganic material composition Y value obtains Y=0 at an interface with the anode 12, and obtains Y=1 at an interface with the HTL 14, thereby maintaining 1>Y>0 between the interface with the anode 12 and the interface with the HTL 14. At this time, it is required to maintain the total thickness of the HIL 13 in the range of approx. 0.1 nm to 300 nm.

Accordingly, the HIL 13 is formed of the mixture of the organic and inorganic materials. Thus, it is possible to decrease the thermal stress between the HIL 13 and the anode 12, and to maintain a hole-electron charge balance according as motility of hole is decreased, thereby obtaining great efficiency and long life span in the organic EL device.

In the preferred embodiment of the present invention, the organic material of the HIL 13 is used of NPD(4,4'-bis[N-(1-naphthyl)-N-phenyl-amino]biphenyl), and the inorganic material of the HIL 13 is used of LiF. At this time, the composition ratio of NPD to LiF is 5 to 1. Also, the HIL 13 is formed at a thickness of approx. 30 nm.

Subsequently, the HTL 14 is formed on the HIL 13. The HTL 14 is formed of N,N'-diphenyl-N,N'-bis(3-methylphenyl)-(1,1'biphenyl)-4,4'-diamine(TPD) or 4,4'-bis[N-(1-naphthyl)-N-phenyl-amino]biphenyl (NPD). As shown in FIG. 2, the HTL 14 may be formed in a dual-layered structure having first and second HTLs 14a and 14b. Or, as shown in FIG. 3, the HTL 14 may be formed in a single-layered structure. If the HTL 14 has the two layers, the respective layers are formed of different materials.

In the preferred embodiment of the present invention, the first HTL 14a is formed of NPD (4,4'-bis[N-(1-naphthyl)-N-phenyl-amino]biphenyl) at a thickness of approx. 35 nm. Thereon, the second HTL 14b is formed of NPD ((4,4'-bis[N-(1-naphthyl)-N-phenyl-amino]biphenyl) at a thickness of approx. 40 nm. After that, an organic emitting layer 15 is formed on the HTL 14 at a thickness of approx. 25 nm. In this case, a dopant may be added at needed. For green emission, Coumine derivative (C545T) is doped to Alq3(8-hydroxyquinoline aluminum) at approx. 1%.

Next, an ETL (electron transport layer) 16 and an EIL (electron injecting layer) 17 are sequentially formed on the organic emitting layer 15. The ETL is formed of Alq3(8-hydroxyquinoline aluminum) at a thickness of approx. 35 nm, and the EIL 17 is formed of LiF at a thickness of approx. 0.5 nm. At this time, the ETL 16 and EIL 17 may be omitted according to the type of device. Then, the cathode 18 as a second electrode is formed on the EIL 17, thereby manufacturing the organic EL device. At this time, the cathode 18 is formed of aluminum Al at a thickness of approx. 200 nm.

Figure 4:
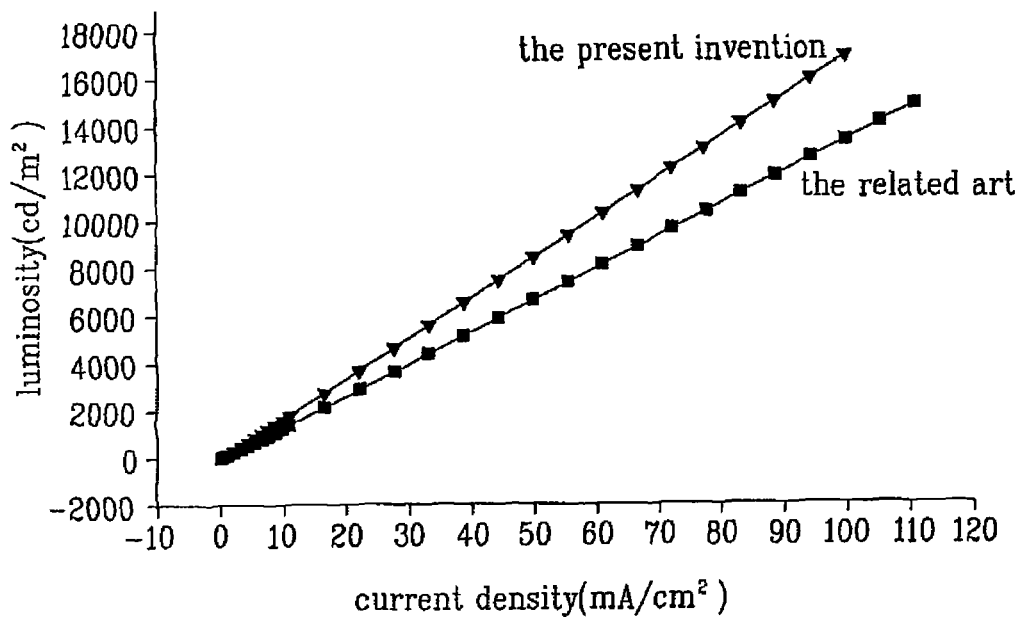
FIG. 4 illustrates a graph showing efficiency of an organic EL device according to the present invention.
Figure 5:
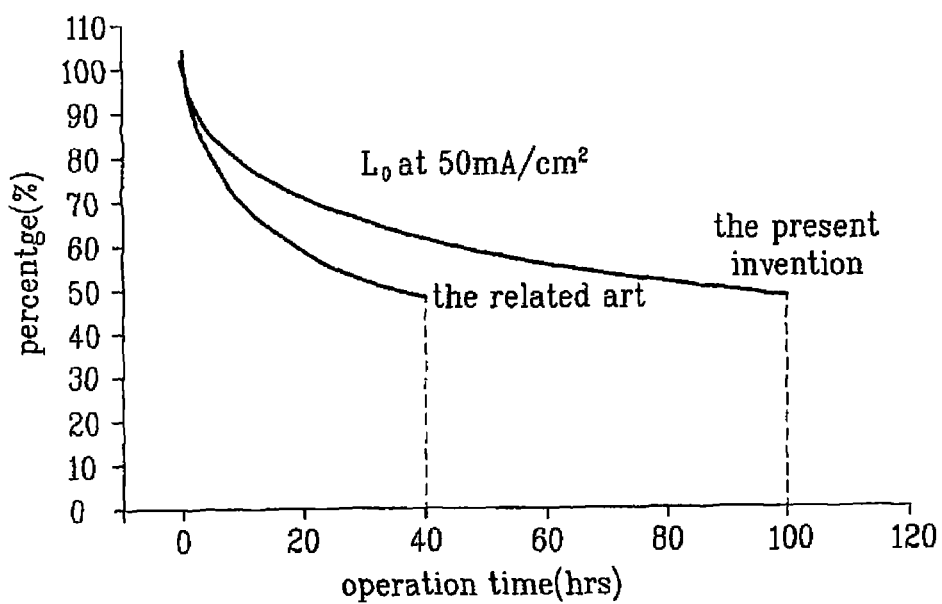
FIG. 5 illustrates a graph showing life span of an organic EL device according to the present invention.

FIG. 4 illustrates a graph comparing efficiency of an organic EL device according to the present invention with that according to the related art, and FIG. 5 illustrates a graph showing life span of an organic EL device according to the present invention with that according to the related art.

In case of the related art shown in FIG. 4 and FIG. 5, only organic material NPD is used for the HIL (hole injection layer).

As shown in FIG. 4, luminosity of the present invention is greater than that of the related art. That is, the brightness of the present invention is greater than that of the related art at the same current density ($mA/cm^2$).

As shown in FIG. 5, the operation time period of the present invention is longer than that of the related art at the current density of 50 $mA/cm^2$.

When comparing efficiency of the organic EL device on condition of 5000 nits, the present invention obtains quantum efficiency of approx. 21.1 cd/A, and the related art obtains quantum efficiency of approx. 13.7 cd/A.

When comparing life span of the organic EL device on condition of 50 $mA/cd^2$, the present invention obtains the operation time period of approx. 100 hours, and the related art obtains the operation time period of approx. 40 hours.

As mentioned above, the organic EL device according to the present invention has the following advantages.

In the organic EL device according to the present invention, it is possible to obtain great luminosity and long life span thereof by decreasing the thermal stress between the anode and the HIL.

Also, the hole-electron charge balance is maintained so that it is possible to improve the quantum efficiency, thereby improving efficiency of the organic EL device.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An organic El device, comprising:
a transparent substrate;
an anode formed on the transparent substrate;
a hole injection layer formed on the first electrode, and formed of a mixture of at least a first organic material and at least one inorganic material;
a first hole transport layer formed on the hole injection layer, and formed of at least a second organic material;
a second hole transport layer formed on the first hole transport layer, and formed of at least a third organic material;
an emitting layer formed on the second hole transport layer;
an electron transport layer formed on the emitting layer;
an electron injecting layer formed on the electron transport layer; and
a cathode formed on the electron injecting layer, wherein the hole injection layer contacts the anode and the first hole transport layer; wherein the first hole transport layer contacts the hole injection layer and the second hole transport layer and; wherein the second hole transport layer contacts with the first hole transport layer and the emitting layer; wherein the first organic material, the second organic material, and the third organic material are different from each other; wherein a thickness of the first hole transport layer is different from a thickness of the second hole transport layer; wherein the thickness of the first hole transport layer is thicker than a thickness of the hole injection layer; wherein the thickness of the second hole transport layer is thicker than a thickness of the emitting layer; and wherein the thickness of the emitting layer is thinner than the thickness of the hole injection layer.

2. The organic EL device as claimed in claim 1, wherein the first organic material of the hole injection layer is any one selected from an aromatic amine compound.

3. The organic EL device as claimed in claim 1, wherein the first organic material of the hole injection layer is expressed as the following chemical formula 1:

Chemical Formula 1

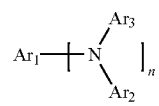

wherein 'n' of the chemical formula 1 is a positive number from 1 to 4, and Ar1, Ar2, and Ar3 are selected from an unsubstituted or substituted aromatic group.

4. The organic El device as claimed in claim 3, wherein the Ar1, Ar2, and Ar3 are one of phenyl, naphthyl, biphenyl, biphenylelnyl, phenanthrenyl, fluorenyl, terphenylyl, and anthracenyl groups.

5. The organic EL device as claimed in claim 3, wherein if substituted, the substituent of Ar1, Ar2, or Ar3 is one of methyl, ethyl, propyl, t-butyl, methoxy, ethoxy, propoxy, dimethylamine, diethylamine, phenyl, fluorine, chlorine, bromine, and diphenylamine groups.

6. The organic EL device as claimed in claim 1, wherein the first organic material of the hole injection layer is any one of the following chemical formulas 2-7:

Chemical Formula 2

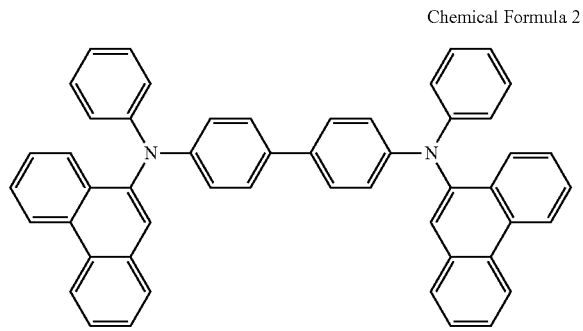

Chemical Formula 3

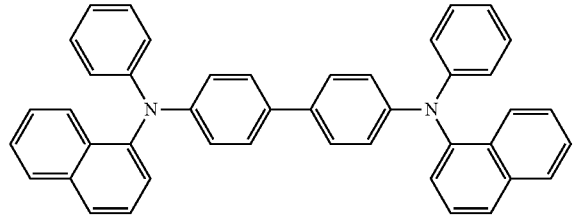

Chemical Formula 4

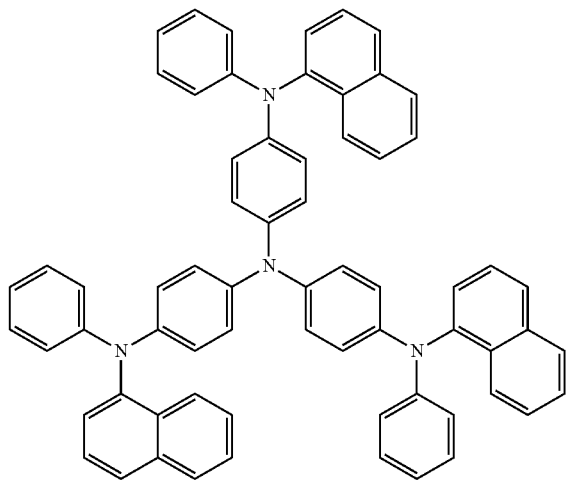

Chemical Formula 5

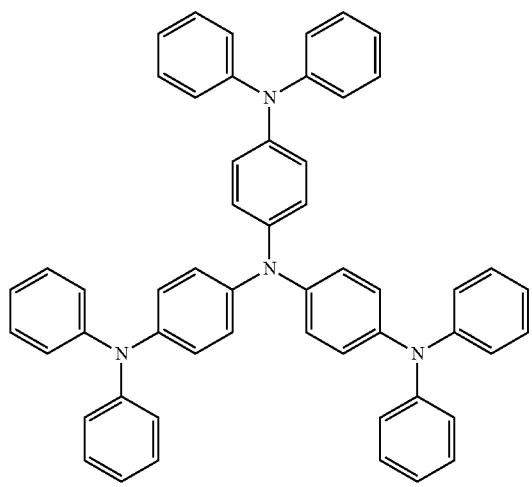

Chemical Formula 6

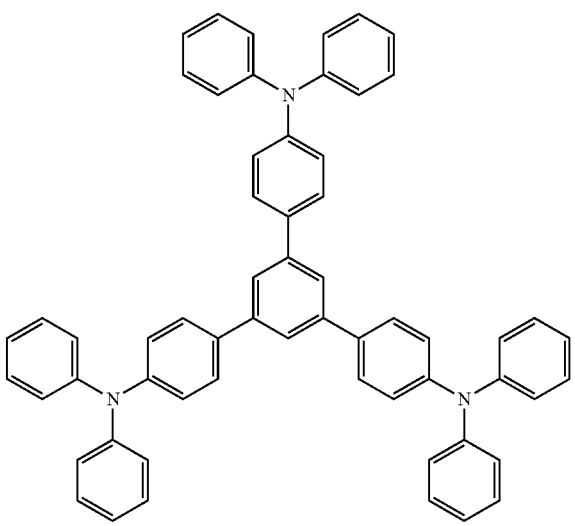

Chemical Formula 7

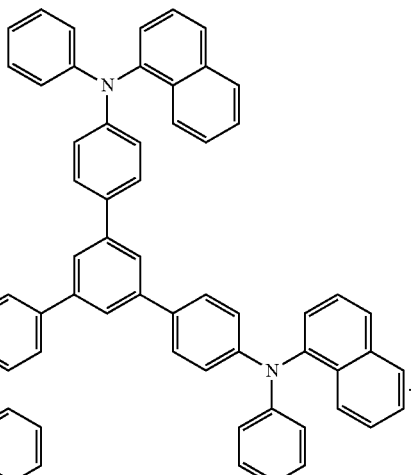

7. The organic EL device as claimed in claim 1, wherein the inorganic material is at 1-90% of the mixture.

8. The organic EL device as claimed in claim 1, wherein the first hole transport layer is formed of N,N'-diphenyl-N,N'-bis(3-methylphenyl)-(1,1'-biphenyl)-4,4'-diamine (TPD), and the second hole transport layer is formed of 4,4'-bis[N-(1-naphthyl)-N-phenyl-amino]biphenyl (NPD).

9. The organic EL device as claimed in claim 1, wherein the first hole transport layer is formed of 4,4'-bis[N-(1-naphthyl)-N-phenyl-amino]biphenyl (NPD), and the second hole transport layer is formed of N,N'-diphenyl-N,N'-bis(3-methylphenyl)-(1,1'-biphenyl)-4,4'-diamine (TPD).

10. The organic EL device as claimed in claim 1, wherein a thickness of the second hole transport layer is thicker than that of the first hole transport layer.

11. An organic EL device, comprising:
a transparent substrate;
an anode formed on the transparent substrate;
a hole injection layer formed on the first electrode, and formed of a mixture of at least a first organic material and at least one inorganic material, wherein the composition ratio of the first organic material of the mixture is more than the composition ratio of the inorganic material;
a first hole transport layer on the hole injection layer, and formed of at least a second organic material;
a second hole transport layer on the first hole transport layer, and formed of at least a third organic material;
an emitting layer formed on the hole transport layer;
an electron transport layer formed on the emitting layer;
an electron injecting layer formed on the electron transport layer; and
a cathode formed on the electron injecting layer, wherein the hole injection layer contacts the anode and the first hole transport layer; wherein the first hole transport layer contacts the hole injection layer and the second hole transport layer; wherein the second hole transport layer contacts the first hole transport layer and the emitting layer; wherein the first organic material, the second organic material, and the third organic material are different from each other; wherein a thickness of the first hole transport layer is different from a thickness of the second hole transport layer; wherein the thickness of the first hole transport layer is thicker than a thickness of the hole injection layer; wherein the thickness of the second hole transport layer is thicker than a thickness of the emitting layer; and wherein the thickness of the emitting layer is thinner than the thickness of the hole injection layer.

12. An organic EL device, comprising:
a transparent substrate;
an anode formed on the transparent substrate;
a hole injection layer formed on the anode, and fowled of a mixture of at least a first organic material and at least one inorganic material;
a hole transport layer having at least two layers on the hole injection layer, and formed of a plurality of second organic materials;
an emitting layer formed on the hole transport layer;
an electron transport layer fowled on the emitting layer;
an electron injecting layer fainied on the electron transport layer; and
a cathode formed on the electron injecting layer, wherein the hole injection layer contacts the anode and the hole transport layer; wherein the hole transport layer contacts the hole injection layer and the emitting layer; wherein at least one of the plurality of second organic materials is different from the first organic material; wherein a thickness of the hole transport layer adjacent to the hole injection layer is different from a thickness of the hole transport layer adjacent to the emitting layer; wherein the thickness of the hole transport layer adjacent to the hole injection layer is thicker than a thickness of the hole injection layer; wherein the thickness of the hole transport layer adjacent to the emitting layer is thicker than a thickness of the emitting layer; and wherein the thickness of the emitting layer is thinner than the thickness of the hole injection layer.

* * * * *